(12) United States Patent
Lee (10) Patent No.: US 7,639,089 B2
(45) Date of Patent: Dec. 29, 2009

(54) CHARGE PUMP WITH REDUCED TURN-OFF TIME AND PHASE LOCKED LOOP INCLUDING THE SAME

(75) Inventor: Kun-Seok Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 11/649,702

(22) Filed: Jan. 4, 2007

(65) Prior Publication Data

US 2007/0272923 A1 Nov. 29, 2007

(30) Foreign Application Priority Data

May 25, 2006 (KR) ...................... 10-2006-0047036

(51) Int. Cl.
  *H03L 7/00* (2006.01)
(52) U.S. Cl. ...................... 331/17; 331/177 R; 327/157; 327/148; 327/112; 327/391
(58) Field of Classification Search ................ 327/157, 327/148, 112, 391; 375/374; 330/262, 311; 331/17, 177 R
  See application file for complete search history.

(56) References Cited

U.S. PATENT DOCUMENTS

| | | | |
|---|---|---|---|
| 6,420,914 B1 | 7/2002 | Hasegawa | 327/112 |
| 6,919,746 B2 | 7/2005 | Suzuki | 327/157 |
| 2005/0156673 A1* | 7/2005 | Pretl et al. | 331/16 |

OTHER PUBLICATIONS

Korean Patent Application No. 1020010086667 to Jun et al., having Publication date of Jul. 4, 2003 (w/ English Abstract page).
Japanese Patent Application No. 2002-376520 to Masahito, having Publication date of Jul. 22, 2004 (w/ English Abstract page).

* cited by examiner

*Primary Examiner*—Michael B Shingleton
(74) *Attorney, Agent, or Firm*—Monica H. Choi (57) ABSTRACT

A charge pump includes a current source/sink unit that charges/discharges an output node in response to an UP/DOWN signal generated by a PFD (phase frequency detector). The charge pump also includes a pull-down/pull-up unit configured to discharge/charge a cascode node within the current source/sink unit for a limited time period after the UP/DOWN signal reaches a threshold level during transition of the UP/DOWN signal for turning off the current source/sink unit.

20 Claims, 10 Drawing Sheets

CHARGE PUMP WITH REDUCED TURN-OFF TIME AND PHASE LOCKED LOOP INCLUDING THE SAME

BACKGROUND OF THE INVENTION

This application claims priority under 35 U.S.C. § 119 to Korean Patent Application No. 2006-47036, filed on May 25, 2006 in the Korean Intellectual Property Office, the disclosure of which is incorporated herein in its entirety by reference.

1. Field of the Invention

The present invention relates generally to charge pumps, and more particularly, to a charge pump with reduced turn-off time, especially for use in a phase locked loop.

2. Background of the Invention

Figure 1A:
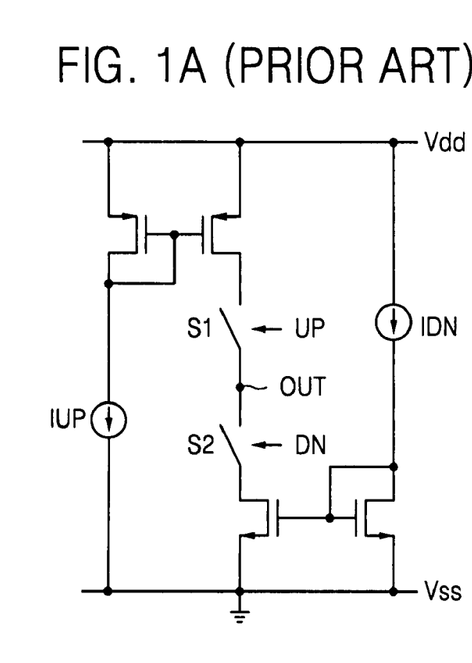
FIGS. 1A, 1B, and 1C illustrate conventional charge pumps.
Figure 1B:
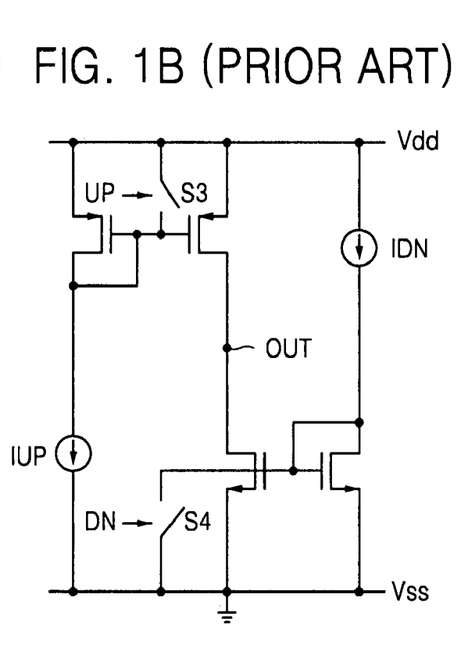
Figure 1C:
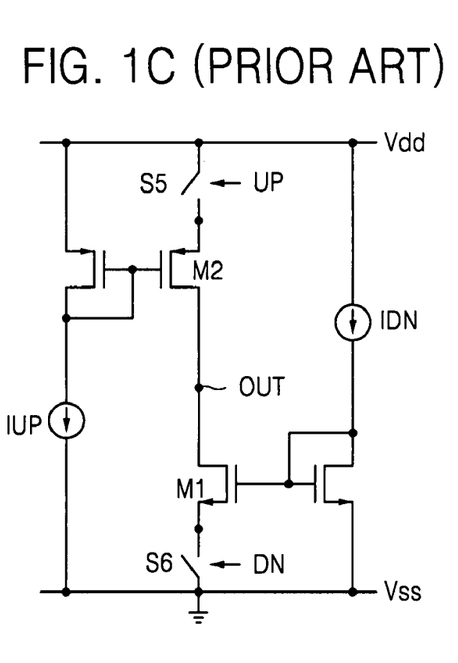

FIGS. 1A, 1B, and 1C show conventional charge pumps that are categorized as one of a drain switching type (FIG. 1A), a gate switching type (FIG. 1B), or a source switching type (FIG. 1C). Each category depends on the position of a respective set of switches (S1 and S2 in FIG. 1A, S3 and S4 in FIG. 1B, and S5 and S6 in FIG. 1C).

Figure 2A:
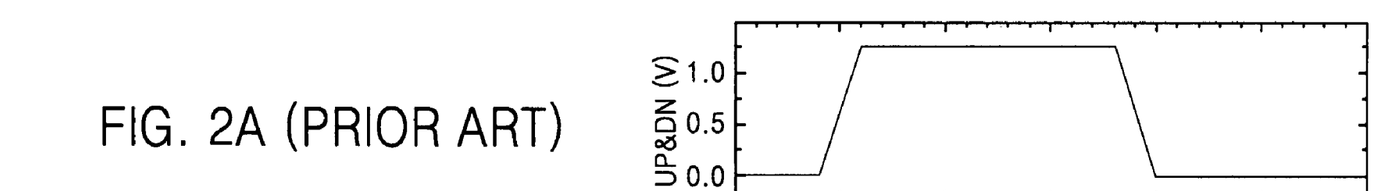
FIG. 2A illustrates a timing chart of control signals UP and DN for the charge pumps of FIGS. 1A, 1B, and 1C.
Figure 2B:
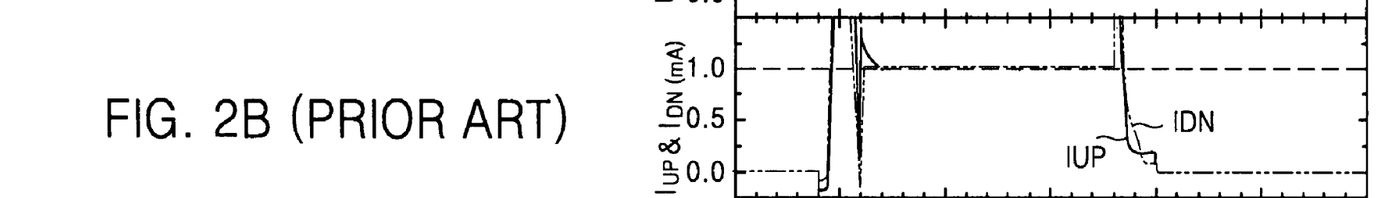
FIGS. 2B, 2C, and 2D illustrate current characteristics of the charge pumps of FIGS. 1A, 1B, and 1C, respectively.
Figure 2C:
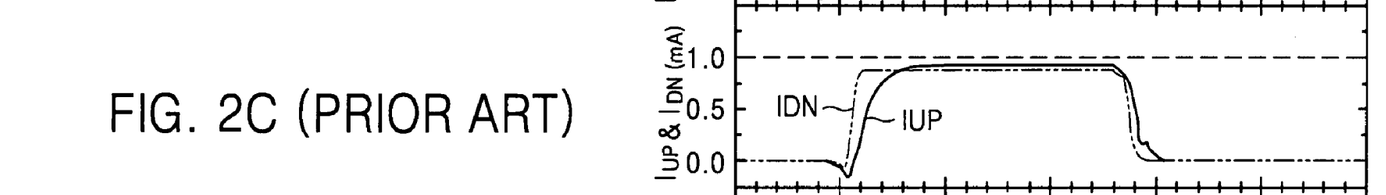
Figure 2D:
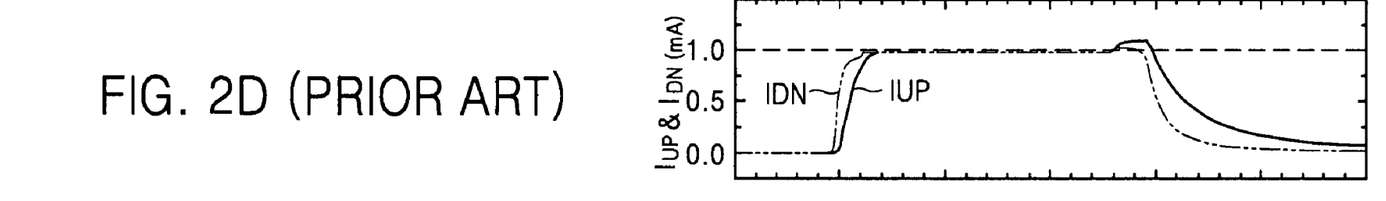

FIG. 2A illustrates a timing chart of control signals UP and DN for controlling such switches S1, S2, S3, S4, S5, and S6. FIG. 2B illustrates up (IUP) and down (IDN) current characteristics of the drain switching type charge pump of FIG. 1A. FIG. 2C illustrates the up (IUP) and down (IDN) current characteristics of the gate switching type charge pump of FIG. 1B. FIG. 2D illustrates the up (IUP) and down (IDN) current characteristics of the source switching type charge pump of FIG. 1C.

The source switching type charge pump of FIG. 1C typically exhibits the best up/down current matching, turn-on time, and turn-off time among the charge pumps of FIGS. 1A, 1B, and 1C. Accordingly, the source switching type charge pumps are widely used.

However, the source switching type charge pump in FIG. 1C does not have a discharge path for discharging residual charge remaining at the node between the switch S5 and a transistor M2 and at the node between the switch S6 and a transistor M1, during turn-off. Thus, such residual charge remains for a great amount of time such that the transistors M1 and M2 remain in a slight turn-on. When the source switching type charge pump is used in a phase locked loop, during a lock state, noise and spurious reference characteristics for an output terminal of the phase locked loop may be deteriorated from such transistors M1 and M2.

Figure 3:
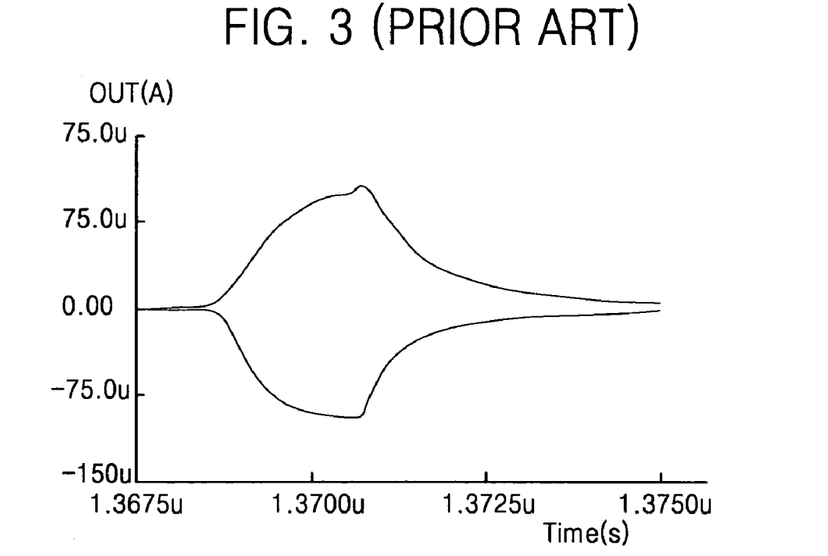
FIG. 3 illustrates output current characteristics of a source switching type charge pump of FIG. 1C during turn-on and turn-off.

FIG. 3 illustrates output current characteristics of the source switching type charge pump of FIG. 1C during turn-on and turn-off. Referring to FIG. 3, turn-off time is very long in the source switching type charge pump.

Figure 4:
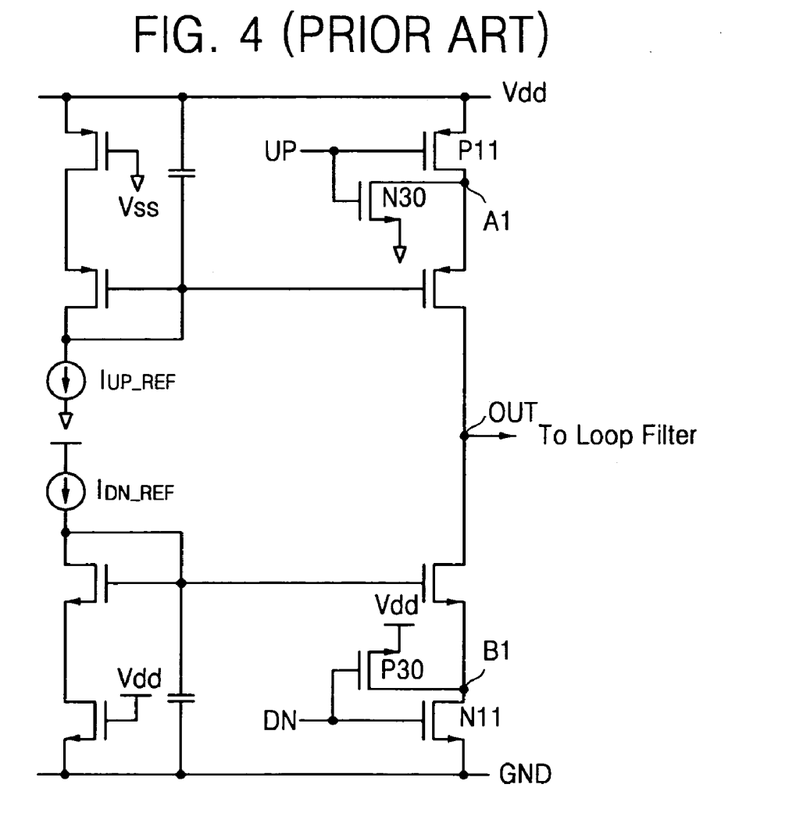
FIG. 4 illustrates another conventional source switching type charge pump.
Figure 5:
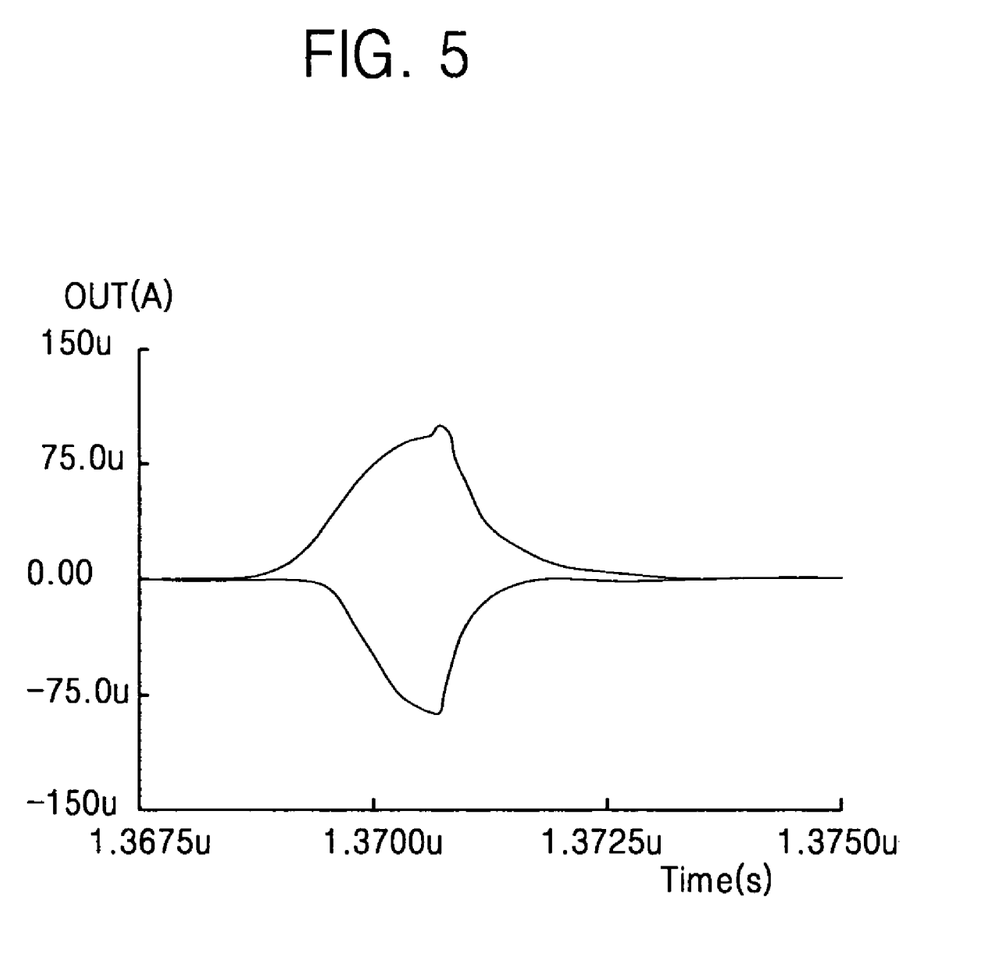
FIG. 5 illustrates output current characteristics of the source switching type charge pump of FIG. 4 during turn-on and turn-off.

FIG. 4 shows another conventional source switching type charge pump. FIG. 5 illustrates output current characteristics of the source switching type charge pump of FIG. 4 during turn-on and turn-off. Referring to FIGS. 4 and 5, the conventional source switching type charge pump of FIG. 4 includes a pull-up transistor P30 and a pull-down transistor N30 to discharge residual charge from intermediate nodes B1 and A1, respectively.

In the source switching type charge pump of FIG. 4 including the pull-up transistor P30 and the pull-down transistor N30, turn-off time is improved, but turn-on time is increased. In this case, mismatch between an up-current $I_{UP\_REF}$ and a down-current $I_{DN\_REF}$ is increased very high until transistors N11 and P11 are turned on sufficiently.

In addition, the conventional source switching type charge pump includes transistors assembled in cascode for increased output impedance. However, turning on the pull-up and pull-down transistors P30 and N30 may decrease the output impedance resulting in degradation of noise and spurious characteristics.

SUMMARY OF THE INVENTION

Accordingly, a charge pump of embodiments of the present invention includes pull-up and pull-down units that are configured to be turned on for a limited time period.

A charge pump according to an aspect of the present invention includes a current source unit and a pull-down unit. The current source unit provides a charging current to an output node in response to an UP signal generated by a PFD (phase frequency detector). The pull-down unit is configured to discharge a first cascode node within the current source unit for a first predetermined time period after the UP signal reaches a first threshold level during transition of the UP signal for turning off the current source unit. The first predetermined time period ends substantially before the UP signal subsequently turns on the current source unit.

A charge pump according to another aspect of the present invention includes a current sink unit and a pull-up unit. The current sink unit provides a discharging current to the output node in response to a DOWN signal generated by the PFD (phase frequency detector). The pull-up unit is configured to charge a second cascode node within the current sink unit for a second predetermined time period after the DOWN signal reaches a second threshold level during transition of the DOWN signal for turning off the current sink unit. The second predetermined time period ends substantially before the DOWN signal subsequently turns on the current sink unit.

The current sink unit according to one embodiment of the present invention includes a current mirror NMOSFET (N-channel metal oxide semiconductor field effect transistor) and a switching NMOSFET. The current mirror NMOSFET is coupled between the output node and the second cascode node. The switching NMOSFET is coupled between the second cascode node and a low voltage supply, and the DOWN signal is applied at a gate of the switching NMOSFET.

The current sink unit according to another embodiment of the present invention further includes a matching NMOSFET and a diode-connected NMOSFET. The matching NMOSFET has a source coupled to the low voltage supply and has a gate coupled to a high voltage supply. The diode-connected NMOSFET is coupled between a drain of the matching NMOSFET, a current source, and a gate of the current mirror NMOSFET.

The current sink unit according to a further embodiment of the present invention includes first and second sink mirror NMOSFETs. The first sink mirror NMOSFET has a drain coupled to a source of the current mirror NMOSFET at the second cascode node and has a source coupled to a drain of the switching NMOSFET. The second sink mirror NMOSFET has a drain coupled to a source of the diode-connected NMOSFET, has a source coupled to the drain of the matching NMOSFET, and has a gate coupled to a gate of the first sink mirror NMOSFET.

The current source unit according to an embodiment of the present invention includes a current mirror PMOSFET (P-channel metal oxide semiconductor field effect transistor) and a switching PMOSFET. The current mirror PMOSFET is coupled between the output node and the first cascode node. The switching PMOSFET is coupled between the first cascode node and the high voltage supply, and the UP signal is applied at a gate of the switching PMOSFET.

The current source unit according to another embodiment of the present invention includes a matching PMOSFET and a diode-connected PMOSFET. The matching PMOSFET has a source coupled to the high voltage supply and has a gate coupled to the low voltage supply. The diode-connected PMOSFET is coupled between a drain of the matching PMOSFET, a current source, and a gate of the current mirror PMOSFET.

The current source unit according to a further embodiment of the present invention includes first and second source mirror PMOSFETs. The first source mirror PMOSFET has a drain coupled to a source of the current mirror PMOSFET at the first cascode node and has a source coupled to a drain of the switching PMOSFET. The second source mirror PMOSFET has a drain coupled to a source of the diode-connected PMOSFET, has a source coupled to the drain of the matching PMOSFET, and has a gate coupled to a gate of the first source mirror PMOSFET.

The pull-down unit according to an embodiment of the present invention includes a pull-down NMOSFET coupled between the first cascode node and a low voltage supply. A gate of the pull-down NMOSFET has a pull-down control signal applied there-on with the pull-down control signal being transitioned to a logic high level for the first predetermined time period after the UP signal reaches the first threshold level.

The pull-up unit according to an embodiment of the present invention includes a pull-up PMOSFET coupled between the second cascode node and the high voltage supply. A gate of the pull-up PMOSFET has a pull-up control signal applied there-on with the pull-up control signal being transitioned to a logic low level for the second predetermined time period after the DOWN signal reaches the second threshold level.

In this manner, because the pull-up and pull-down units are turned on for a limited amount of time, the first and second nodes of the current source and current sink units are not discharged or charged too much such that the voltage at such nodes may be recovered quickly. In addition, the output impedance of the charge pump is high for a substantial amount of time such that noise and spurious characteristics are not degraded with the pull-up and pull-down units.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7A, 7B, 8, 9, 10, 11, 12, and 13 refer to elements having similar structure and/or function.

DETAILED DESCRIPTION OF THE INVENTION

Figure 6:
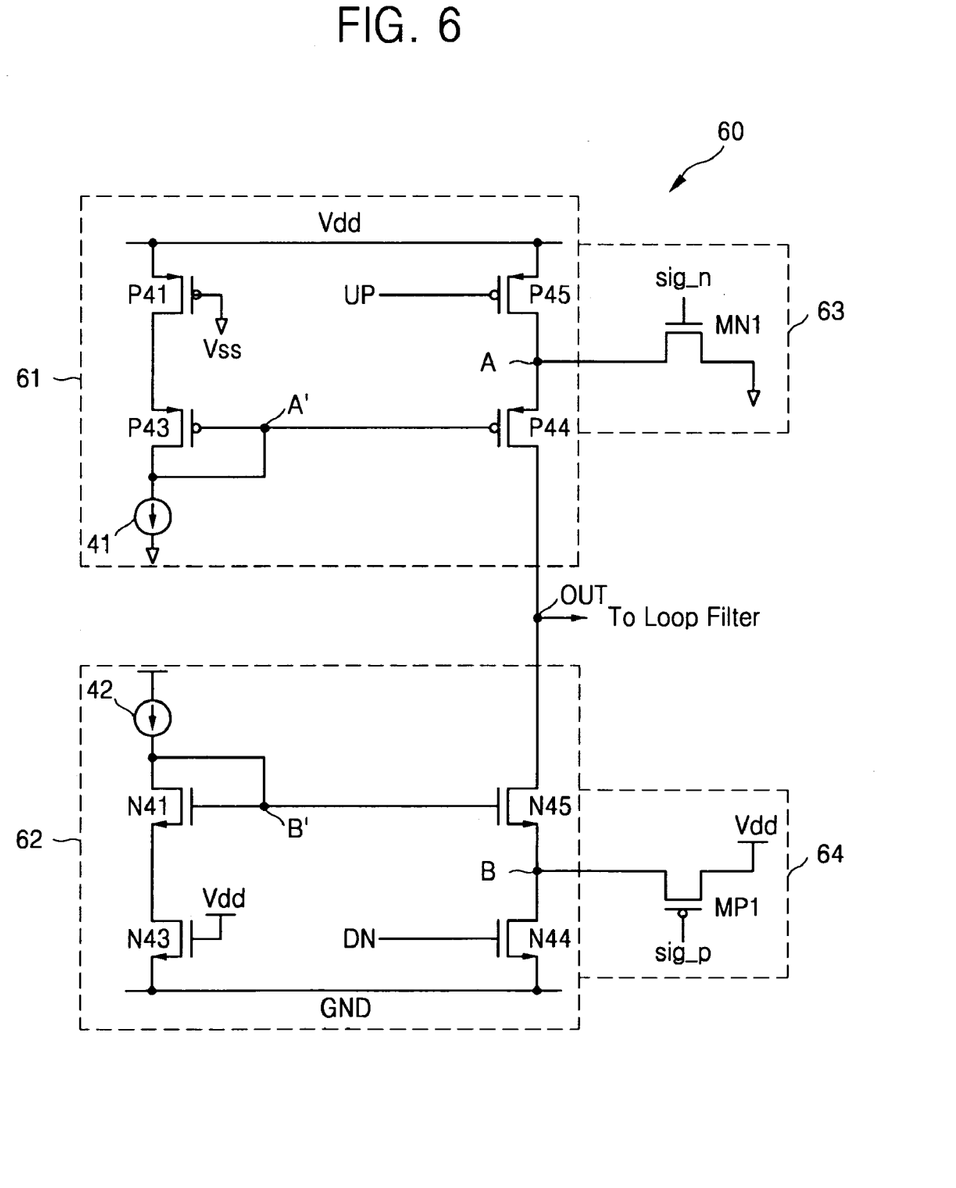
FIG. 6 illustrates a charge pump with pull-up and pull-down transistors configured to be turned on for a limited time according to an embodiment of the present invention.

FIG. 6 illustrates a charge pump 60 according to an embodiment of the present invention. The charge pump (or linear charge pump) 60 includes a current source unit 61, a current sink unit 62, a pull-down unit 63, and a pull-up unit 64.

The current source unit 61 includes a matching PMOSFET (P-channel metal oxide semiconductor field effect transistor) P41, a diode-connected PMOSFET P43, a current mirror PMOSFET P44, and a switching PMOSFET P45, in an example embodiment of the present invention. The matching PMOSFET P41 has a source coupled to a high voltage supply Vdd, has a gate coupled to a low voltage supply Vss for always being turned on, and has a drain coupled to a source of the diode-connected PMOSFET P43.

The diode-connected PMOSFET P43 has a drain and gate coupled together to a gate node A' of the current mirror PMOSFET P44 and to a first reference current source 41. The PMOSFETs P43 and P44 form a current mirror such that a first reference current of the current source 41 is mirrored to an output node OUT. Alternatively, the width to length ratios of the PMOSFETs P43 and P44 may be designed such that a multiple of the first reference current may be mirrored to the output node OUT.

The switching PMOSFET P45 has a source coupled to the high voltage supply Vdd, has a gate with an UP control signal applied thereon, and has a drain coupled to a source of the current mirror PMOSFET P44 at a first node A. The current mirror PMOSFET P44 has a drain coupled to the output node OUT.

The pull-down unit 63 is implemented with a pull-down NMOSFET MN1 in an embodiment of the present invention. The pull-down NMOSFET MN1 is connected between the first node A and the low voltage supply Vss which may be a ground node for example. The gate of the pull-down NMOSFET MN1 has a pull-down control signal sig_n applied thereon.

The current sink unit 62 includes a diode-connected NMOSFET (N-channel metal oxide semiconductor field effect transistor) N41, a matching NMOSFET N43, a switching NMOSFET N44, and a current-mirror NMOSFET N45, in an example embodiment of the present invention. The matching NMOSFET N43 has a source coupled to the low voltage supply Vss which is the ground node GND in FIG. 6, has a gate coupled to the high voltage supply Vdd for always being turned on, and has a drain coupled to a source of the diode-connected NMOSFET N41.

The diode-connected NMOSFET N41 has a drain and gate coupled together to a gate node B' of the current mirror NMOSFET N45 and to a second reference current source 42. The NMOSFETs N41 and N45 form a current mirror such that a second reference current of the current source 42 is mirrored to the output node OUT. Alternatively, the width to length ratios of the NMOSFETs N41 and N45 may be designed such that a multiple of the second reference current may be mirrored to the output node OUT.

The switching NMOSFET N44 has a source coupled to the ground node GND, has a gate with an DOWN (DN) control signal applied thereon, and has a drain coupled to a source of the current mirror NMOSFET N45 at a second node B. The current mirror NMOSFET N45 has a drain coupled to the output node OUT.

The pull-up unit 64 is implemented with a pull-up PMOSFET MP1 in an embodiment of the present invention. The pull-up PMOSFET MP1 is connected between the second node B and the high voltage supply Vdd. The gate of the pull-up PMOSFET MP1 has a pull-up control signal sig_p applied thereon.

Operation of the charge pump 60 of FIG. 6 is now described with reference to the signal timing diagrams of FIGS. 7A and 7B.

Figure 7A:
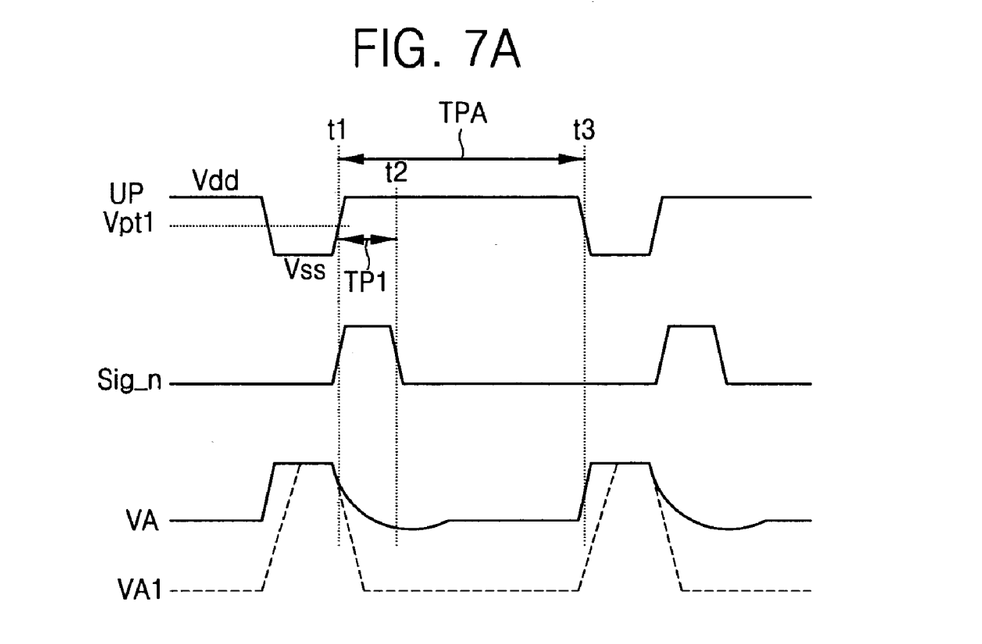
FIG. 7A is a timing diagram of a control signal for the pull-down transistor in the charge pump of FIG. 6, according to an embodiment of the present invention.

FIG. 7A illustrates an example of the UP control signal that is set to the logic low level Vss (i.e., the voltage of the, low voltage supply) for turning on the switching PMOSFET P45. In that case, the current source unit 61 is turned on such that the current from the first reference current source 41 is mirrored to the output node OUT for charging the output node OUT.

Thereafter, the UP control signal transitions back to the logic high level Vdd (i.e., the voltage of the high voltage supply) for turning off the current source unit 61. The UP control signal reaches a first threshold voltage level Vpt1 during such a transition at time point t1 in FIG. 7A. At that point, the pull-down control signal sig_n has transitioned toward the logic high level Vdd to turn on the pull-down NMOSFET MN1 for discharging the first node A. In addition, the pull-down control signal sig_n is configured to remain at the logic high level Vdd for a first predetermined time period TP1 after the time point t1 to the time point t2.

The UP control signal transitions again down to the logic low level Vss at time point t3 to subsequently turn on the current source unit 61 for charging up the output node OUT again. In an aspect of the present invention, the first predetermined time period TP1 ends substantially before the UP signal subsequently turns on the current source unit 61 at time point t3. For example, the total time period TPA from the time point t1 to the time point t3 is substantially higher (such as at least twice as high) than the first predetermined time period TP1.

Note that by turning on the pull-down NMOSFET MN1 for discharging the first node A, the turn-off time for the current source unit 61 is reduced. However, by limiting the first predetermined time period TP1 for turning on the pull-down NMOSFET MN1, a voltage VA at the first node A may be recovered more quickly for faster operation of the charge pump 60.

For example, FIG. 7A illustrates a voltage VA1 of a node A1 of the charge pump of FIG. 4 that is completely pulled down to a ground level in response to the UP control signal set at the logic high level. In contrast in the charge pump 60 according to an embodiment of the present invention, the voltage VA at the first node A is discharged less from the pull-down NMOSFET MN1 being turned on for only the limited time period TP1. Thus, the voltage VA of the first node A in FIG. 6 may be recovered more quickly than the voltage VA1 of the node A1 in FIG. 4.

Figure 7B:
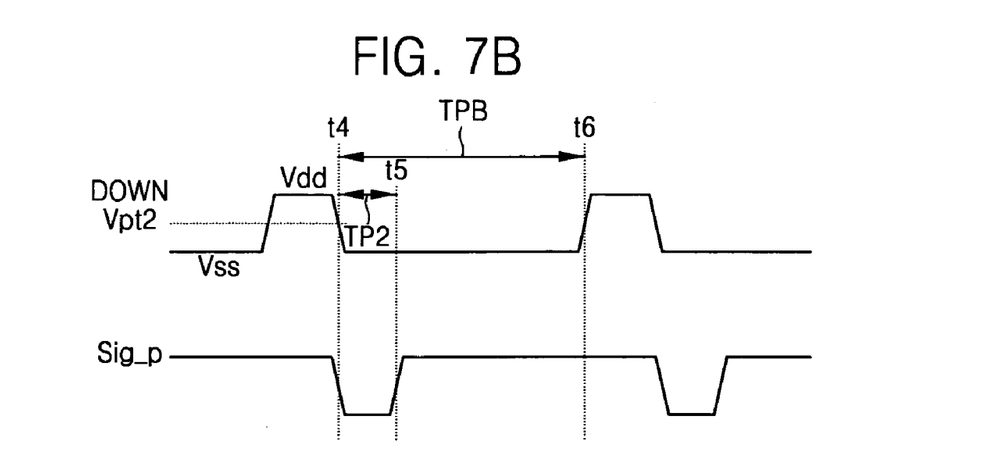
FIG. 7B is a timing diagram of a control signal for the pull-up transistor in the charge pump of FIG. 6, according to an embodiment of the present invention.

Similarly, FIG. 7B illustrates an example of the DOWN (DN) control signal that is activated to the logic high level Vdd for turning on the switching NMOSFET N44. In that case, the current sink unit 62 is turned on such that the current from the second reference current source 42 is mirrored to the output node OUT for discharging the output node OUT.

Thereafter, the DOWN control signal transitions back to the logic low level Vss for turning off the current sink unit 62. The DOWN control signal reaches a second threshold voltage level Vpt2 during such a transition at time point t4 in FIG. 7B. At that point, the pull-up control signal sig_p has transitioned toward the logic low level Vss to turn on the pull-up PMOSFET MP1 for charging the second node B. In addition, the pull-up control signal sig_p is configured to remain at the logic low level Vss for a second predetermined time period TP2 after the time point t4 to the time point t5.

The DOWN control signal transitions again up to the logic high level Vdd at time point t6 to subsequently turn on the current sink unit 62 for discharging the output node OUT again. In an aspect of the present invention, the second predetermined time period TP2 ends substantially before the DOWN signal subsequently turns on the current sink unit 62 at time point t6. For example, the total time period TPB from the time point t4 to the time point t6 is substantially higher (such as at least twice as high) than the second predetermined time period TP2.

Figure 8:
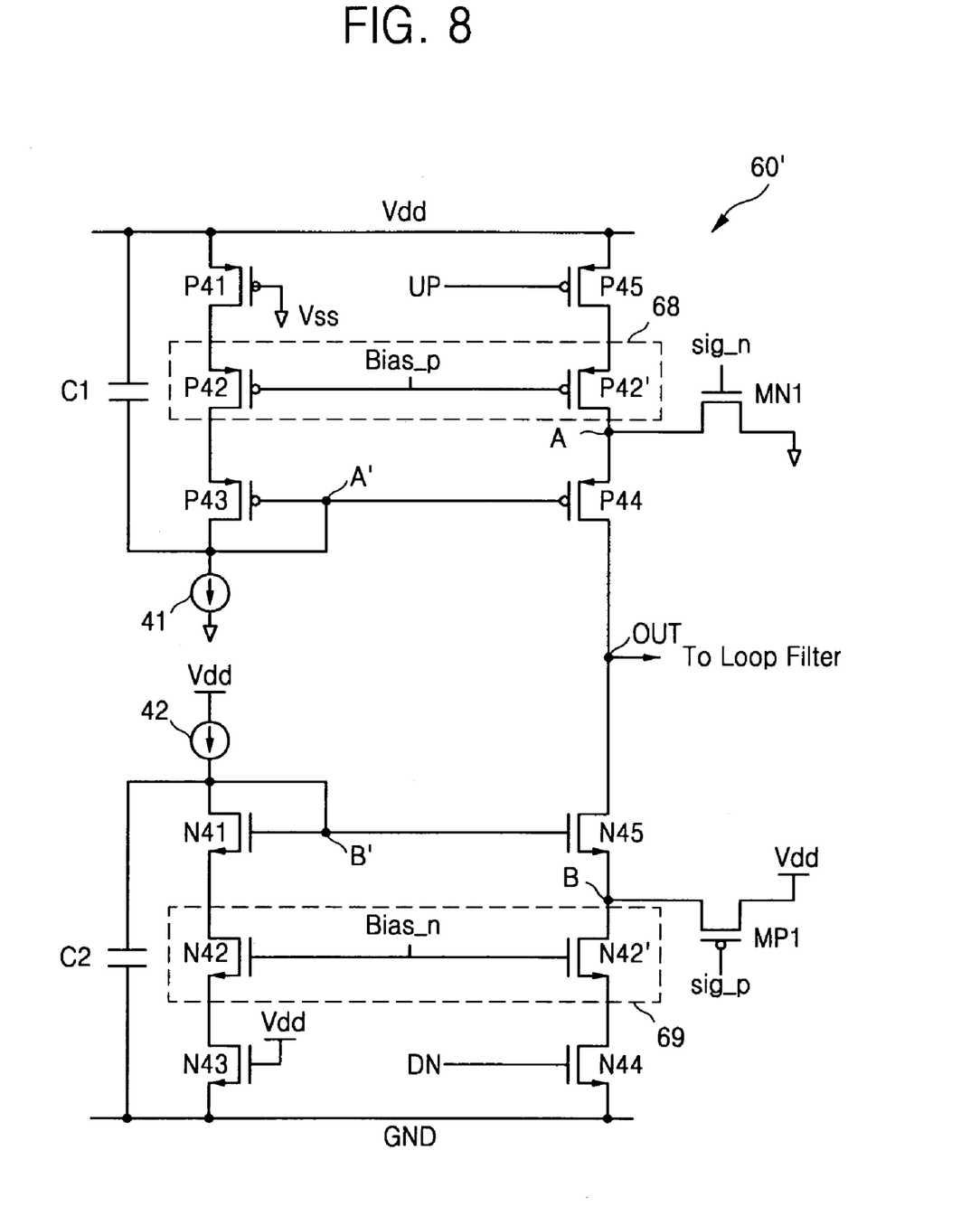
FIG. 8 illustrates a charge pump with additional cascode transistors, according to another embodiment of the present invention.

FIG. 8 illustrates a charge pump 60' according to another embodiment of the present invention. The charge pump (or linear charge pump) 60' of FIG. 8 has similar structure to that of the charge pump 60 of FIG. 6. Elements with the same reference number in FIGS. 6 and 8 have similar structure and/or function, and a description there of is not repeated.

Referring to FIGS. 6 through 8, the charge pump 60' of FIG. 8 further includes a first capacitor C1, a second capacitor C2, a source mirror unit 68, and a sink mirror unit 69. The source mirror unit 68 includes a first source mirror PMOSFET P42 and a second source mirror PMOSFET P42'. The sink mirror unit 69 includes a first sink mirror NMOSFET N42 and a second sink mirror NMOSFET N42'.

A source and a drain of the first source mirror PMOSFET P42 are connected between the drain of the matching PMOSFET P41 and the source of the diode-connected PMOSFET P43. A source and a drain of the second source mirror PMOSFET P42' are connected between the drain, of the switching PMOSFET P45 and the source of the current mirror PMOSFET P44. The gates of the first and second source mirror PMOSFETs P42 and P42' are connected together with a first gate bias control signal Bias_p being applied thereon.

A source and a drain of the first sink mirror NMOSFET N42 are connected between the drain of the matching NMOSFET N43 and the source of the diode-connected NMOSFET N41. A source and a drain of the second sink mirror NMOSFET N42' are connected between the drain of the switching NMOSFET N44 and the source of the current mirror NMOS- FET N45. The gates of the first and second sink mirror NMOSFETs N42 and N42' are connected together with a second gate bias control signal Bias_n being applied thereon.

The source mirror unit 68 and the sink mirror unit 69 increase the output impedance at the output terminal OUT by increasing the number of cascoded MOSFETs coupled to the output terminal OUT. The charge pump 60' of FIG. 8 may also be implemented with a higher number of source mirror unit 68 and the sink mirror unit 69 connected in series for further increasing the output impedance at the output terminal OUT.

The first capacitor C1 is connected between the high voltage supply Vdd and the node A' to prevent current flowing in the first source mirror PMOSFET P42 from being rapidly mirrored to the second source mirror PMOSFET P42'. Accordingly, the first capacitor C1 serves to ensure stability in the current mirrored to the second source mirror PMOSFET P42'.

The second capacitor C2 is connected between the node B' and the ground voltage GND to prevent current flowing in the first sink mirror NMOSFET N42 from being rapidly mirrored to the second sink mirror NMOSFET N42'. Accordingly, the second capacitor C2 serves to ensure stability in the current mirrored to the second sink mirror NMOSFET N42'.

Figure 9:
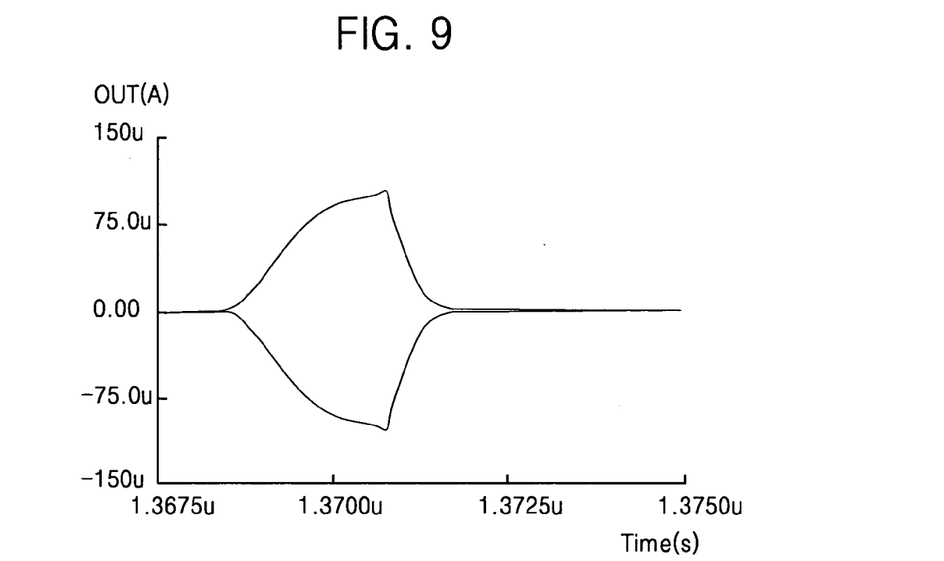
FIG. 9 illustrates output current characteristics of the charge pumps of FIGS. 6 and 8.

FIG. 9 illustrates output current characteristics of the charge pumps 60 and 60' of FIGS. 6 and 8. Referring to FIG. 9, current at the output terminal OUT is increased rapidly when the current source unit 61 and the current sink unit 62 are turned on and is decreased rapidly when turned off. In other words, turn-off time is short for the charge pumps 60 and 60' of the present invention.

Figure 10:
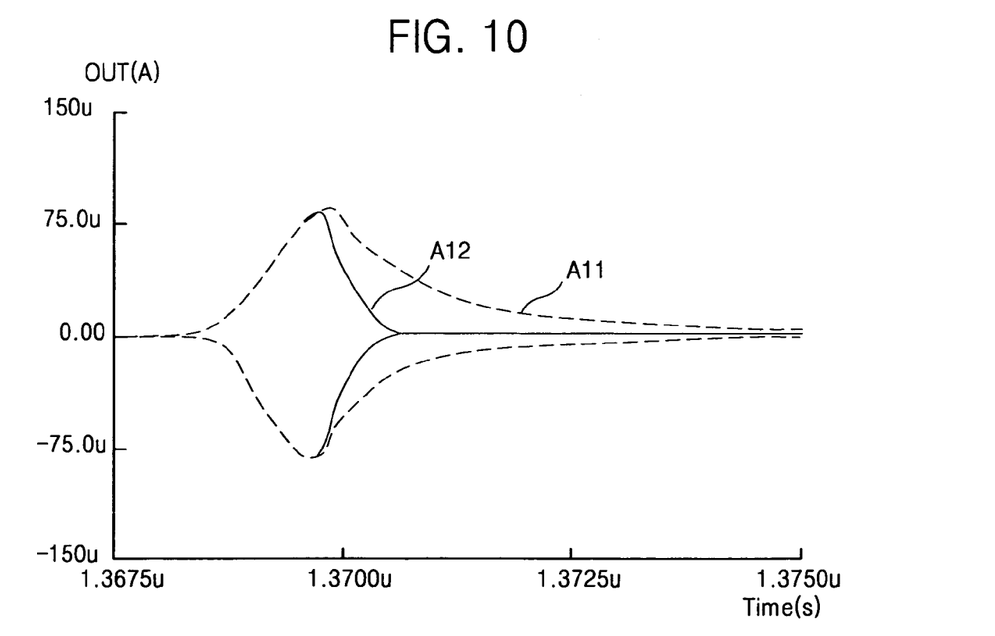
FIG. 10 illustrates a comparison between the output current characteristics of FIG. 9 and the output current characteristics of FIG. 3.

FIG. 10 illustrates a comparison between the output current characteristics of FIG. 9 and the output current characteristics of FIG. 3. Referring to FIG. 10, when turn-on time is 1.5 nano-seconds during a lock state within a phase locked loop, a curve A11 shows a current waveform of the conventional source switching type charge pump of FIG. 1C, and a curve A12 shows a current waveform of the charge pumps 60 and 60' according to the present invention. Referring to FIG. 10, the turn-off time is remarkably reduced in the charge pumps 60 and 60' according to the present invention as compared to that of the prior art charge pump of FIG. 1C.

Figure 11:
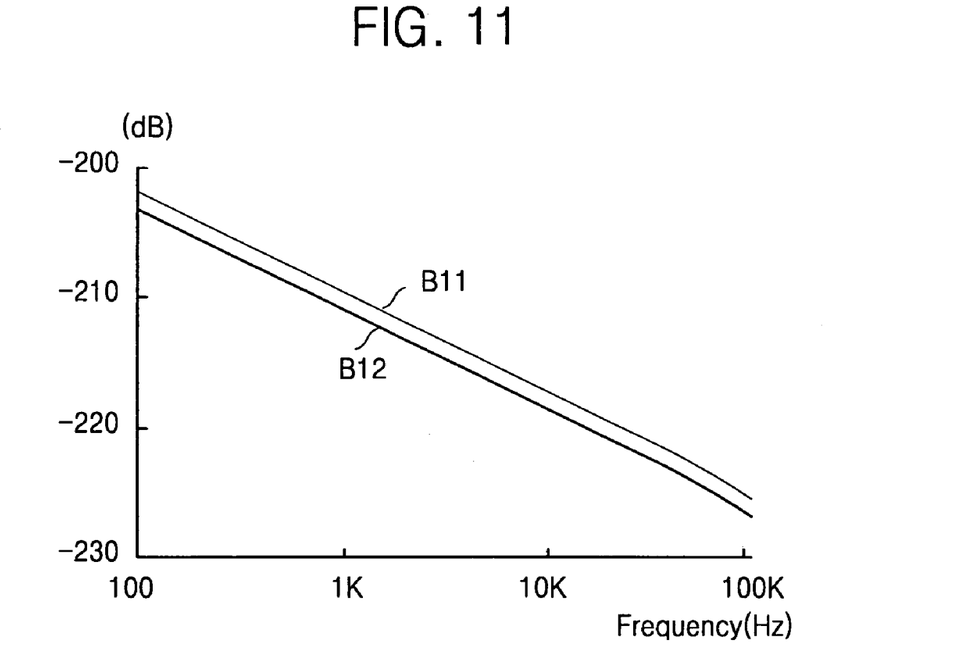
FIG. 11 illustrates a comparison between noise characteristics of output current for the charge pumps of FIGS. 6 and 8 and the prior art charge pumps of FIGS. 1C and 4.

FIG. 11 illustrates a comparison between a noise characteristic for the output current of the charge pumps 60 and 60' of FIGS. 6 and 8 and a noise characteristic of the output current for the prior art charge pumps of FIGS. 1C and 4. Referring to FIG. 11, the current noise characteristic B12 at the output terminal OUT in the charge pumps 60 and 60' of the present invention is improved by 2 dB compared to the current noise characteristic B11 at the output terminal of prior art charge pump of FIGS. 1C and 4. In other words, in-band phase noise of a phase locked loop using charge pump 60 or 60' of the present invention is improved by 2 dB compared to that of a phase locked loop using the prior art charge pump.

Figure 12:
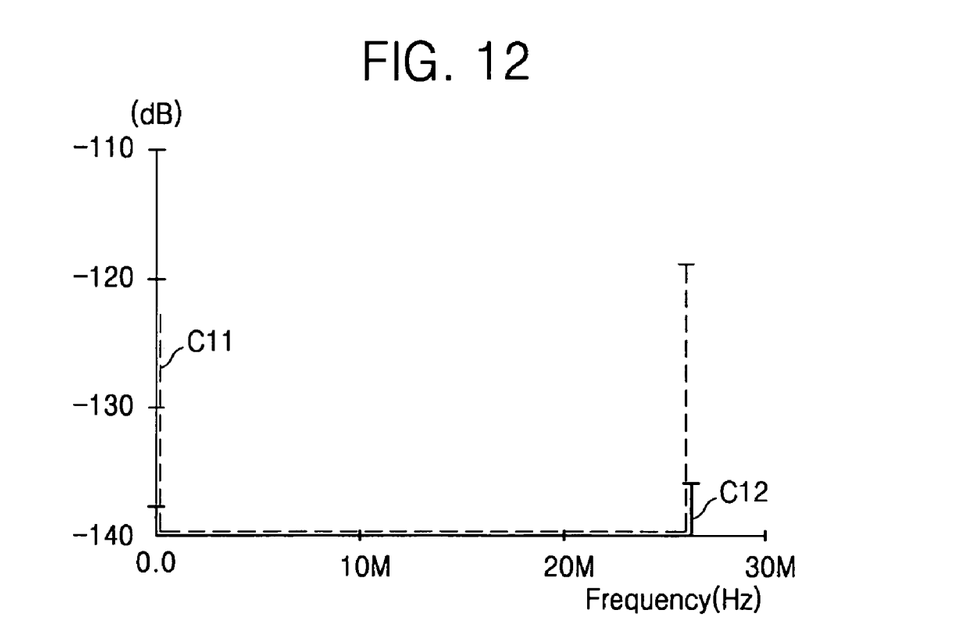
FIG. 12 illustrates a comparison between spurious characteristics at the output node in the charge pumps of FIGS. 6 and 8 and the charge pumps of FIGS. 1C and 4.

FIG. 12 illustrates a comparison between a spurious characteristic at an output terminal in the charge pumps 60 and 60' of FIGS. 6 and 8 and a spurious characteristic at an output terminal in the prior art charge pumps of FIGS. 1C and 4. Referring to FIG. 12, during a lock state, a spurious characteristic C12 at the output terminal OUT of the charge pumps 60 and 60' of the present invention is improved by 18 dB compared to a spurious characteristic C11 at the output terminal of the prior art charge pump of FIG. 1C and 4. In other words, the linearity of the charge pumps 60 and 60' of the present invention is improved for improved spurious characteristic.

Figure 13:
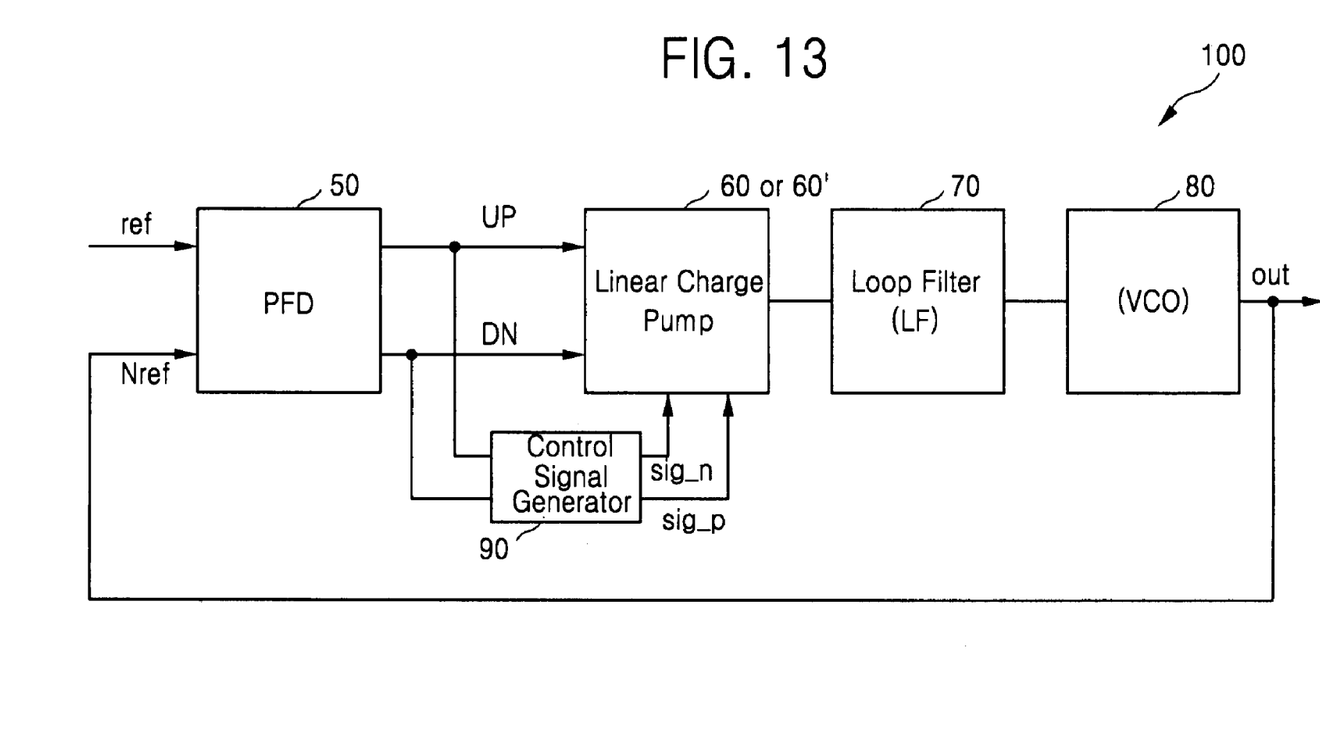
FIG. 13 shows a block diagram of a phase locked loop including the charge pump of FIG. 6 or 8, according to an embodiment of the present invention.

FIG. 13 shows a block diagram of a phase locked loop 100 including the charge pump 60 or 60' of FIG. 6 or 8. Referring to FIG. 13, the phase locked loop 100 also includes a phase frequency detector (PFD) 50, the charge pump (or the linear charge pump) 60 or 60' of FIG. 6 or 8, a loop filter (LF) 70, a voltage controlled oscillator (VCO) 80, and a control signal generator 90.

The phase frequency detector 50 receives a predetermined reference signal ref and a feedback signal Nref. The phase frequency detector 50 generates the UP and DOWN (DN) control signals according to a phase difference between such signals ref and Nref. Generally, the phase frequency detector 50 sets the respective logic levels of the UP and DOWN (DN) control signals for minimizing the phase difference between such signals ref and Nref.

The control signal generator 90 generates the pull-down control signal Sig_n and the pull-up control signal Sig_p from the UP and DOWN (DN) control signals, as illustrated in FIGS. 7A and 7B. In addition, for the charge pump 60' of FIG. 8, the control signal generator 90 may generate the gate bias control signals Bias_p and Bias_n.

The output of the charge pump 60 or 60' is input to the loop filter 70 that generates a filtered signal there-from. The voltage controlled oscillator 80 generates the feedback signal Nref from such filtered signal of the loop filter 70. A frequency divider having a predetermined division ratio may be interposed between the voltage controlled oscillator 80 and the phase frequency detector 50.

In this manner, because the pull-up and pull-down units 63 and 64 are turned on for a limited amount of time, the first and second nodes A and B within the current source unit 61 and current sink unit 62 are not discharged or charged too much such that the voltage at such nodes A and B may be recovered quickly for faster switching operation. In addition, the output impedance of the charge pump is high for a substantial amount of time such that the noise and spurious characteristics are not degraded with such pull-up and pull-down units.

The foregoing is by way of example only and is not intended to be limiting. For example, any numbers or number of elements described and illustrated herein is by way of example only. In addition, any type of device or any type of material as described or illustrated herein is by way of example only.

The present invention is limited only as defined in the following claims and equivalents thereof.

What is claimed is:

1. A charge pump comprising:

a current source unit that provides a charging current to an output node in response to an UP signal generated by a PFD (phase frequency detector); and a pull-down unit configured to turn on to discharge a first cascode node within the current source unit for a first predetermined time period after the UP signal reaches a first threshold level during transition of the UP signal for turning off the current source unit, wherein the current source unit is configured to be controlled by the UP signal to not provide any charging current to the output node continuously for a first total time period from the UP signal reaching the first threshold level, and wherein the first total time period is at least twice said first predetermined time period with the pull-down unit being configured to be turned off at the end of the first predetermined time period.

2. The charge pump of claim 1, further comprising:

a current sink unit that provides a discharging current to the output node in response to a DOWN signal generated by the PFD (phase frequency detector); and a pull-up unit configured to charge a second cascode node within the current sink unit for a second predetermined time period after the DOWN signal reaches a second threshold level during transition of the DOWN signal for turning off the current sink unit, wherein the second predetermined time period ends substantially before the DOWN signal subsequently turns on the current sink unit.

3. The charge pump of claim 2, wherein the current sink unit includes:

a current mirror NMOSFET (N-channel metal oxide semiconductor field effect transistor) coupled between the output node and the second cascode node; and a switching NMOSFET coupled between the second cascode node and a low voltage supply, wherein the DOWN signal is applied at a gate of the switching NMOSFET.

4. The charge pump of claim 3, wherein the current sink unit further includes:

a matching NMOSFET having a source coupled to the low voltage supply and having a gate coupled to a high voltage supply; and a diode-connected NMOSFET coupled between a drain of the matching NMOSFET, a current source, and a gate of the current mirror NMOSFET.

5. The charge pump of claim 4, wherein the current sink unit further includes:

a first sink mirror NMOSFET having a drain coupled to a source of the current mirror NMOSFET at the second cascode node and having a source coupled to a drain of the switching NMOSFET;

a second sink mirror NMOSFET having a drain coupled to a source of the diode-connected NMOSFET, having a source coupled to the drain of the matching NMOSFET, and having a gate coupled to a gate of the first sink mirror NMOSFET; and a capacitor coupled between the low voltage supply and the drain of the diode-connected NMOSFET.

6. The charge pump of claim 2, wherein the pull-up unit includes:

a pull-up PMOSFET (P-channel metal oxide semiconductor field effect transistor) coupled between the second cascode node and a high voltage supply, wherein a gate of the pull-up PMOSFET has a pull-up control signal applied there-on with the pull-up control signal being transitioned to a logic low level for the second predetermined time period after the DOWN signal reaches the second threshold level.

7. The charge pump of claim 1, wherein the current source unit includes:

a current mirror PMOSFET (P-channel metal oxide semiconductor field effect transistor) coupled between the output node and the first cascode node; and a switching PMOSFET coupled between the first cascode node and a high voltage supply, wherein the UP signal is applied at a gate of the switching PMOSFET.

8. The charge pump of claim 7, wherein the current source unit further includes:

a matching PMOSFET having a source coupled to the high voltage supply and having a gate coupled to a low voltage supply; and a diode-connected PMOSFET coupled between a drain of the matching PMOSFET, a current source, and a gate of the current mirror PMOSFET.

9. The charge pump of claim 8, wherein the current source unit further includes:

a first source mirror PMOSFET having a drain coupled to a source of the current mirror PMOSFET at the first cascode node and having a source coupled to a drain of the switching PMOSFET;

a second source mirror PMOSFET having a drain coupled to a source of the diode-connected PMOSFET, having a source coupled to the drain of the matching PMOSFET, and having a gate coupled to a gate of the first source mirror PMOSFET; and a capacitor coupled between the high voltage supply and the drain of the diode-connected PMOSFET.

10. The charge pump of claim 1, wherein the pull-down unit includes:

a pull-down NMOSFET (N-channel metal oxide semiconductor field effect transistor) coupled between the first cascode node and a low voltage supply, wherein a gate of the pull-down NMOSFET has a pull-down control signal applied there-on with the pull-down control signal being transitioned to a logic high level for the first predetermined time period after the UP signal reaches the first threshold level.

11. A charge pump comprising:

a current sink unit that provides a discharging current to an output node in response to a DOWN signal generated by a PFD (phase frequency detector); and a pull-up unit configured to turn on to charge a cascode node within the current sink unit for a predetermined time period after the DOWN signal reaches a threshold level during transition of the DOWN signal for turning off the current sink unit, wherein the current sink unit is configured to be controlled by the DOWN signal to not provide any discharging current to the output node continuously for a total time period from the DOWN signal reaching the threshold level, and wherein the total time period is at least twice said predetermined time period with the pull-up unit being configured to be turned off at the end of the predetermined time period.

12. The charge pump of claim 11, wherein the current sink unit includes:

a current mirror NMOSFET (N-channel metal oxide semiconductor field effect transistor) coupled between the output node and the cascode node; and a switching NMOSFET coupled between the second cascode node and a low voltage supply, wherein the DOWN signal is applied at a gate of the switching NMOSFET.

13. The charge pump of claim 12, wherein the current sink unit further includes:

a matching NMOSFET having a source coupled to the low voltage supply and having a gate coupled to a high voltage supply; and a diode-connected NMOSFET coupled between a drain of the matching NMOSFET, a current source, and a gate of the current mirror NMOSFET.

14. The charge pump of claim 13, wherein the current sink unit further includes:

a first sink mirror NMOSFET having a drain coupled to a source of the current mirror NMOSFET at the second cascode node and having a source coupled to a drain of the switching NMOSFET;

a second sink mirror NMOSFET having a drain coupled to a source of the diode-connected NMOSFET, having a source coupled to the drain of the matching NMOSFET, and having a gate coupled to a gate of the first sink mirror NMOSFET; and a capacitor coupled between the low voltage supply and the drain of the diode-connected NMOSFET.

15. The charge pump of claim 11, wherein the pull-up unit includes:
a pull-up PMOSFET (P-channel metal oxide semiconductor field effect transistor) coupled between the second cascode node and a high voltage supply, wherein a gate of the pull-up PMOSFET has a pull-up control signal applied there-on with the pull-up control signal being transitioned to a logic low level for the second predetermined time period after the DOWN signal reaches the second threshold level.

16. A phase locked loop comprising:
a loop filter for generating a filtered signal from a pumped signal;
a voltage controlled oscillator for generating a feedback signal in response to the filtered signal;
a phase frequency detector for generating an UP signal and a DOWN signal by comparing the feedback signal with a reference signal;
a control signal generator for generating a pull-down control signal and a pull-up control signal from the UP and DOWN signals; and
a charge pump for generating the pumped signal from the pull-up and pull-down control signals and the UP and DOWN signals, wherein the charge pump includes:
a current source unit that provides a charging current to an output node in response to the UP signal;
a pull-down unit configured with the pull-down control signal to turn on to discharge a first cascode node within the current source unit for a first predetermined time period after the UP signal reaches a first threshold level during transition of the UP signal for turning off the current source unit,
wherein the current source unit is configured to be controlled by the UP signal to not provide any charging current to the output node continuously for a first total time period from the UP signal reaching the first threshold level,
and wherein the first total time period is at least twice said first predetermined time period with the pull-down unit being configured to turn off at the end of the first predetermined time period;
a current sink unit that provides a discharging current to the output node in response to the DOWN signal; and
a pull-up unit configured with the pull-up control signal to turn on to charge a second cascode node within the current sink unit for a second predetermined time period after the DOWN signal reaches a second threshold level during transition of the DOWN signal for turning off the current sink unit,
wherein the current sink unit is configured to be controlled by the DOWN signal to not provide any discharging current to the output node continuously for a second total time period from the DOWN signal reaching the second threshold level,
and wherein the second total time period is at least twice said second predetermined time period with the pull-up unit being configured to turn off at the end of the second predetermined time period.

17. The phase locked loop of claim 16, wherein the current sink unit includes:
a current mirror NMOSFET (N-channel metal oxide semiconductor field effect transistor) coupled between the output node and the second cascode node; and
a switching NMOSFET coupled between the second cascode node and a low voltage supply, wherein the DOWN signal is applied at a gate of the switching NMOSFET;

and wherein the current source unit includes:
a current mirror PMOSFET (P-channel metal oxide semiconductor field effect transistor) coupled between the output node and the first cascode node; and
a switching PMOSFET coupled between the first cascode node and a high voltage supply, wherein the UP signal is applied at a gate of the switching PMOSFET.

18. The phase locked loop of claim 17, wherein the current sink unit further includes:
a matching NMOSFET having a source coupled to the low voltage supply and having a gate coupled to the high voltage supply; and
a diode-connected NMOSFET coupled between a drain of the matching NMOSFET, a current source, and a gate of the current mirror NMOSFET;
and wherein the current source unit further includes:
a matching PMOSFET having a source coupled to the high voltage supply and having a gate coupled to the low voltage supply; and
a diode-connected PMOSFET coupled between a drain of the matching PMOSFET, a current source, and a gate of the current mirror PMOSFET.

19. The phase locked loop of claim 18, wherein the current sink unit further includes:
a first sink mirror NMOSFET having a drain coupled to a source of the current mirror NMOSFET at the second cascode node and having a source coupled to a drain of the switching NMOSFET;
a second sink mirror NMOSFET having a drain coupled to a source of the diode-connected NMOSFET, having a source coupled to the drain of the matching NMOSFET, and having a gate coupled to a gate of the first sink mirror NMOSFET; and
a first capacitor coupled between the low voltage supply and the drain of the diode-connected NMOSFET,
and wherein the current source unit further includes:
a first source mirror PMOSFET having a drain coupled to a source of the current mirror PMOSFET at the first cascode node and having a source coupled to a drain of the switching PMOSFET;
a second source mirror PMOSFET having a drain coupled to a source of the diode-connected PMOSFET, having a source coupled to the drain of the matching PMOSFET, and having a gate coupled to a gate of the first source mirror PMOSFET,
a second capacitor coupled between the high voltage supply and the drain of the diode-connected PMOSFET.

20. The phase locked loop of claim 16, wherein the pull-up unit includes:
a pull-up PMOSFET (P-channel metal oxide semiconductor field effect transistor) coupled between the second cascode node and a high voltage supply, wherein a gate of the pull-up PMOSFET has the pull-up control signal applied there-on with the pull-up control signal being transitioned to a logic low level for the second predetermined time period after the DOWN signal reaches the second threshold level,
and wherein the pull-down unit includes:
a pull-down NMOSFET (N-channel metal oxide semiconductor field effect transistor) coupled between the first cascode node and a low voltage supply, wherein a gate of the pull-down NMOSFET has the pull-down control signal applied there-on with the pull-down control signal being transitioned to a logic high level for the first predetermined time period after the UP signal reaches the first threshold level.

* * * * *